(12) United States Patent
Eguchi et al.

(10) Patent No.: US 10,771,053 B2
(45) Date of Patent: Sep. 8, 2020

(54) SEMICONDUCTOR DEVICE HAVING FIRST AND SECOND SWITCHING REGIONS RESPECTIVELY CONTROLLED BY FIRST AND SECOND CONTROL SIGNALS OUTPUT BY A CONTROLLER

(71) Applicant: Mitsubishi Electric Corporation, Tokyo (JP)

(72) Inventors: Keisuke Eguchi, Tokyo (JP); Takahiro Inoue, Tokyo (JP); Rei Yoneyama, Tokyo (JP); Shiori Uota, Tokyo (JP); Haruhiko Murakami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/415,643

(22) Filed: May 17, 2019

(65) Prior Publication Data

US 2020/0083882 A1    Mar. 12, 2020

(30) Foreign Application Priority Data

Sep. 10, 2018 (JP) ................. 2018-168916

(51) Int. Cl.
| | |
|---|---|
| *H03K 17/687* | (2006.01) |
| *H03K 17/567* | (2006.01) |
| *H01L 25/16* | (2006.01) |
| *H01L 25/07* | (2006.01) |
| *H01L 25/18* | (2006.01) |

(52) U.S. Cl.
CPC ......... *H03K 17/567* (2013.01); *H01L 25/072* (2013.01); *H01L 25/16* (2013.01); *H01L 25/18* (2013.01); *H03K 17/6871* (2013.01)

(58) Field of Classification Search
CPC .. H03K 17/567; H03K 17/6871; H01L 25/18; H01L 25/072; H01L 25/16
USPC ........................................... 327/427
See application file for complete search history.

(56) References Cited

U.S. PATENT DOCUMENTS

| | | | |
|---|---|---|---|
| 6,249,111 B1* | 6/2001 | Nguyen | ............ H02M 3/1588 323/282 |
| 6,353,309 B1* | 3/2002 | Ootani | ................ H03K 17/122 323/282 |

(Continued)

FOREIGN PATENT DOCUMENTS

WO    2014/038064 A1    3/2014

*Primary Examiner* — Ryan Jager
(74) *Attorney, Agent, or Firm* — Studebaker & Brackett PC

(57) ABSTRACT

First and second switching regions include first and second gate electrodes respectively. Channel currents of the first and second switching regions are controlled according to electric charge amounts supplied by control signals input to the first and second gate electrodes respectively. The second switching region is connected in parallel with the first switching region. A control section outputs a first control signal for turning-on the first switching region to the first gate electrode and a second control signal for turning-on the second switching region to the second gate electrode. The control section stops outputting the second control signal after a first predetermined period elapses from a start of outputting the first and second control signals, and outputs the second control signal after a second predetermined period elapses from a stop of outputting the second control signal.

11 Claims, 6 Drawing Sheets

(56) References Cited

U.S. PATENT DOCUMENTS

| | | | | |
|---|---|---|---|---|
| 6,930,473 | B2* | 8/2005 | Elbanhawy | H02M 3/1584 |
| | | | | 323/282 |
| 7,737,666 | B2* | 6/2010 | Sutardja | H02M 3/1588 |
| | | | | 323/222 |
| 10,305,473 | B2* | 5/2019 | Pidutti | H03K 17/122 |
| 2007/0279021 | A1* | 12/2007 | Yanagida | H02M 3/07 |
| | | | | 323/272 |
| 2015/0022282 | A1* | 1/2015 | Kaneko | H03H 11/28 |
| | | | | 333/103 |
| 2015/0102851 | A1* | 4/2015 | Goetzenberger | H03K 17/145 |
| | | | | 327/394 |
| 2015/0303288 | A1 | 10/2015 | Hashimoto et al. | |
| 2018/0254158 | A1* | 9/2018 | Morita | H01H 9/542 |
| 2019/0273494 | A1* | 9/2019 | Matsumoto | H03K 17/687 |

* cited by examiner

SEMICONDUCTOR DEVICE HAVING FIRST AND SECOND SWITCHING REGIONS RESPECTIVELY CONTROLLED BY FIRST AND SECOND CONTROL SIGNALS OUTPUT BY A CONTROLLER

BACKGROUND OF THE INVENTION

Field

The present invention relates to a semiconductor device.

Background

For a semiconductor device mounted with an insulated gate bipolar transistor (IGBT) or a metal oxide semiconductor field effect transistor (MOSFET), which is a semiconductor chip including gate electrodes, there is a demand for a technique to reduce a time change rate (dv/dt) of a voltage applied to both ends of the semiconductor chip when switching from an OFF state to an ON state is performed, that is, during so-called turn-on.

WO 2014/038064 describes a semiconductor device that shifts timing of turn-on of a driving signal supplied to a first gate electrode and timing of turn-on of a driving signal supplied to a second gate electrode by a predetermined time during the turn-on in order to reduce a time change rate (dv/dt) of an output voltage during the turn-on and improve controllability.

SUMMARY

However, in the semiconductor device described in WO 2014/038064, a loss that occurs during the turn-on, that is, a turn-on loss is not sufficiently considered. The turn-on loss has a correlation with a time change rate (dv/dt) of a voltage applied to both ends of a semiconductor chip. When a voltage change applied to both the ends of the semiconductor chip is delayed, that is, when the time change rate (dv/dt) is reduced, the turn-on loss increases, although the controllability is improved.

That is, the time change rate (dv/dt) of the voltage applied to both the ends of the semiconductor chip during the turn-on needs to be adjusted because the controllability is deteriorated when the time change rate (dv/dt) is too large and the turn-on loss increases when the time change rate (dv/dt) is too small.

The present invention has been devised in order to solve the problems described above, and an object of the present invention is to provide a semiconductor device capable of adjusting controllability and a turn-on loss during turn-on by enabling adjustment of a time change rate (dv/dt) of a voltage applied to both ends of a semiconductor chip.

A semiconductor device according to the present invention includes: a first switching region including a first gate electrode wherein a channel current of the first switching region is controlled according to an electric charge amount supplied by a control signal input to the first gate electrode; a second switching region including a second gate electrode and connected in parallel with the first switching region wherein a channel current of the second switching region is controlled according to an electric charge amount supplied by a control signal input to the second gate electrode; and a control section outputting a first control signal for turning-on the first switching region to the first gate electrode and a second control signal for turning-on the second switching region to the second gate electrode, wherein the control section stops outputting the second control signal after a first predetermined period elapses from a start of outputting the first and second control signals, and outputs the second control signal after a second predetermined period elapses from a stop of outputting the second control signal.

The semiconductor device according to the present invention makes it possible to adjust a time change rate (dv/dt) of the voltage applied to both ends of the semiconductor chip during turn-on by the control signal outputted from the control unit. Therefore, a semiconductor device capable of adjusting controllability and a turn-on loss during turn-on can be provided.

Other and further objects, features and advantages of the invention will appear more fully from the following description.

DESCRIPTION OF EMBODIMENTS

First Embodiment

Figure 1:
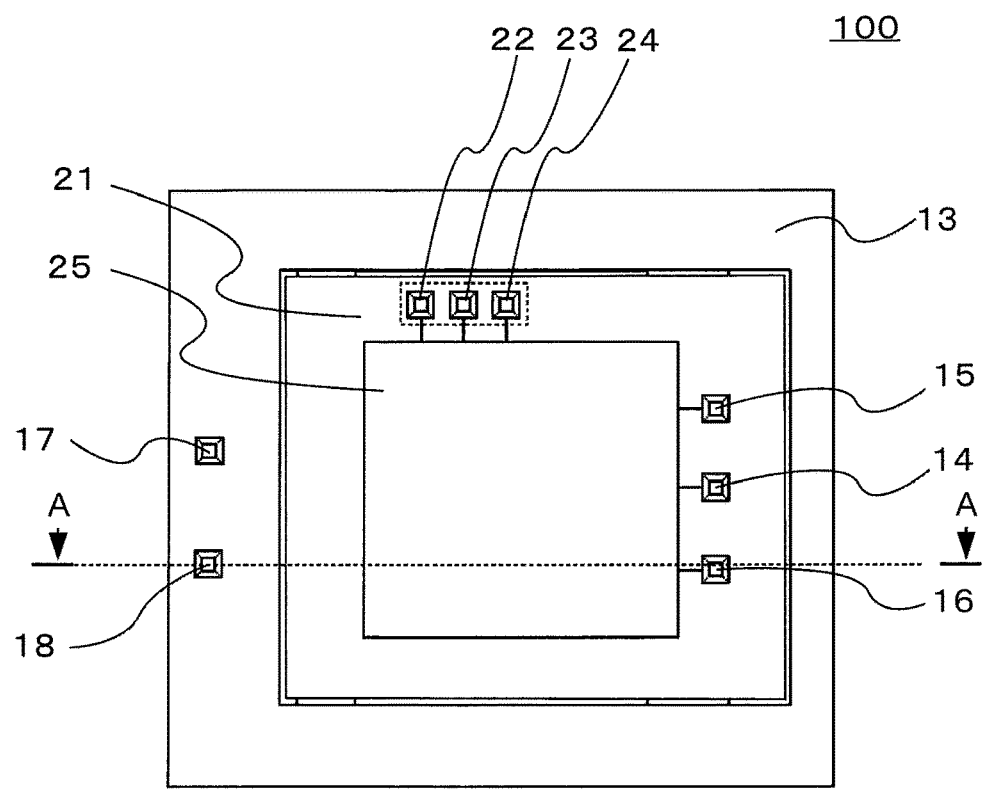
FIG. 1 is a plan view showing the configuration of the semiconductor device according to the first embodiment of the present invention.
Figure 2:
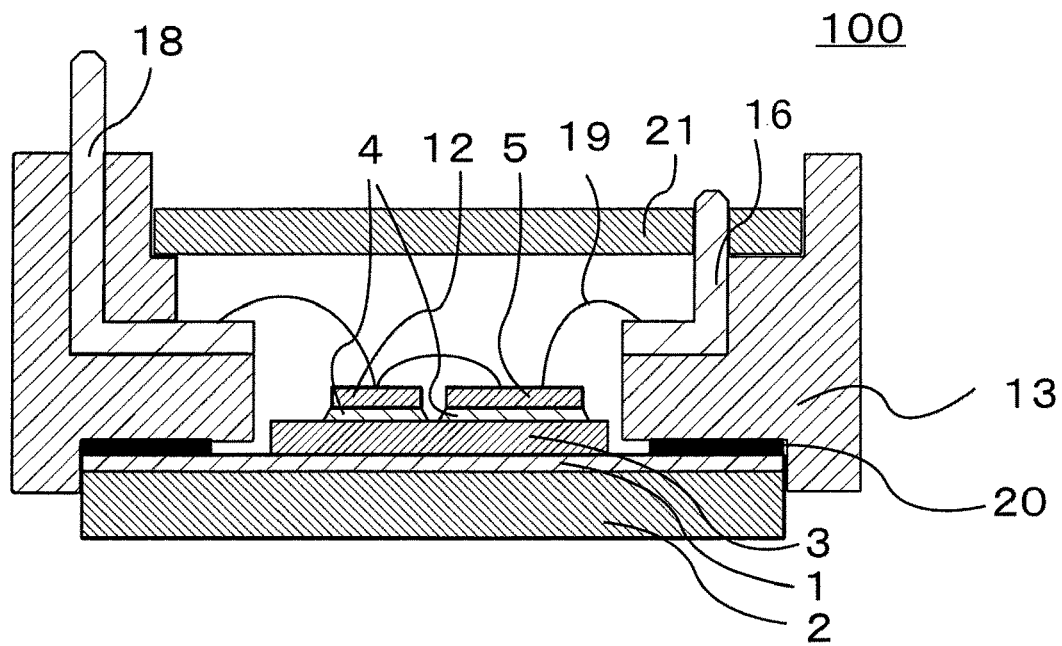
FIG. 2 is a sectional view showing the configuration of the semiconductor device according to the first embodiment of the present invention.

The configuration of a semiconductor device 100 according to a first embodiment of the present invention is explained. FIG. 1 is a plan view showing the configuration of the semiconductor device according to the first embodiment of the present invention. FIG. 2 is a sectional view showing the configuration of the semiconductor device according to the first embodiment. FIG. 1 is a plan view showing the semiconductor device 100 viewed from above. FIG. 2 is a sectional view taken along an A-A line shown in FIG. 1. In FIGS. 1 and 2, several members such as a sealing material filled on the inside of the semiconductor device 100 and a lid provided on the upper surface of the semiconductor device 100 according to necessity are omitted.

In FIG. 1, the semiconductor device 100 includes a resin case 13 having a rectangular shape in plan view and includes a control board 21 on the inner side of the resin case 13. The control board 21 includes a control section 25 and a plurality of input-side terminals and a plurality of output-side terminals. The control board 21 includes the control section 25 and a plurality of independent conductive patterns (not shown). An input side of the control section 25 is connected to the plurality of input-side terminals by the conductive patterns. An output side of the control section 25 is connected to the output-side terminals via the conductive patterns.

The plurality of input-side terminals are a signal input terminal 22, a reference-potential input terminal 23, and a driving-potential input terminal 24. The signal input terminal 22, the reference-potential input terminal 23, and the driving-potential input terminal 24 are respectively configured to be connectable to the outside of the semiconductor device 100. A signal output from a signal generating apparatus 90 provided on the outside is input to the signal input terminal 22. A power supply 91 is connected to the reference-potential input terminal 23 and the driving-potential input terminal 24. The power supply 91 functions as a supply source for supplying electric charges to a gate electrode of a switching device.

The output-side terminals are a reference-potential signal terminal 14, a first driving signal terminal 15, and a second driving signal terminal 16. As explained below, the reference-potential signal terminal 14 is connected to an emitter electrode of the switching device. The first driving-signal terminal 15 is connected to a first gate electrode of the switching device. The second driving signal terminal 16 is connected to a second gate electrode of the switching device.

Each of the conductive patterns on the output side and each of the reference-potential signal terminal 14, the first driving signal terminal 15, and the second driving signal terminal 16 are connected via a hole (not shown) formed in the control board 21. A side surface of the hole is conductive and is electrically connected a conductive pattern 20. The reference-potential signal terminal 14 and the first driving signal terminal 15 are pressed into the hole and electrically connected to the hole by mechanical contact. They may be electrically connected by solder connection or the like without making the side surface of the hole conductive and performing the mechanical contact.

The semiconductor device 100 includes a low-potential-side main electrode 17 and a high-potential-side main electrode 18 that pierce through the resin case 13 and electrically connect the inner side and the outer side of the resin case 13.

The configuration of the semiconductor device 100 is explained with reference to FIG. 2. The semiconductor device 100 includes an insulating layer 1, includes a heat radiation plate 2 on one principal plane of the insulating layer 1, and includes an electric circuit pattern 3 on the other principal plane of the insulating layer 1. The insulating layer 1 may be a ceramics substrate having high thermal conductivity such as aluminum nitride.

A back electrode of a switching device 5 and a back electrode of a recirculation device 12 are connected to the electric circuit pattern 3 via solder 4. The switching device 5 in the first embodiment is configured by, for example, an IGBT of a type driven by two gate signals. The recirculation device 12 is configured by, for example, a diode. The back electrode of the switching device 5 is a collector electrode. The back electrode of the recirculation device 12 is a cathode electrode.

A side surface of the semiconductor device 100 is configured by the resin case 13. The resin case 13 and the insulating layer 1 are bonded by an adhesive material 20.

The reference-potential signal terminal 14, the first driving signal terminal 15, the second driving signal terminal 16, the low-potential-side main electrode 17, and the high-potential-side main electrode 18 are attached to the resin case 13. The reference-potential signal terminal 14, the first driving signal terminal 15, the second driving signal terminal 16, the low-potential-side main electrode 17, and the high-potential-side main electrode 18 are electrically connected to the switching device 5, the recirculation device 12, the electric circuit pattern 3, and the like by wires 19. The reference-potential signal terminal 14, the first driving signal terminal 15, and the second driving signal terminal 16 pierce through a hole provided in the control board 21 and are electrically connected to the conductive pattern 20 formed on the control board 21.

Figure 3:
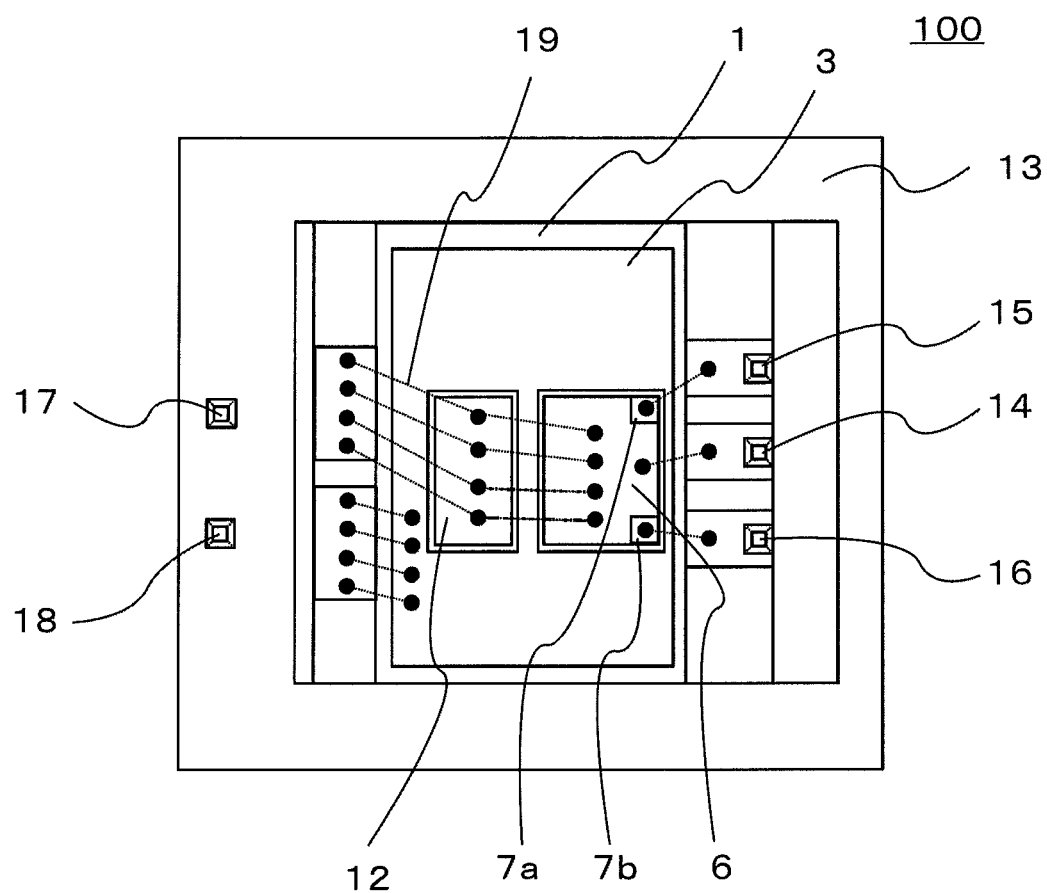
FIG. 3 is a plan view showing a configuration in which the control board of the semiconductor device according to the first embodiment of the present invention is removed.

FIG. 3 is a plan view showing a configuration in which the control board 21 of the semiconductor device 100 according to the first embodiment of the present invention is removed. As shown in FIG. 3, the reference-potential signal terminal 14, the first driving signal terminal 15, the second driving signal terminal 16, the low-potential-side main electrode 17, and the high-potential-side main electrode 18 are fixed to the resin case 13.

The switching device 5 includes, on the surface thereof, an emitter electrode 6, a first gate-signal input section 7a, and a second gate-signal input section 7b. The emitter electrode 6 is connected to the reference-potential signal terminal 14 by the wire 19. The first gate-signal input section 7a is connected to the first driving signal terminal 15 by the wire 19. The second gate signal input section 7b is connected to the second driving signal terminal 16 by the wire 19.

The emitter electrode 6 of the switching device 5 is connected to an anode electrode, which is a surface electrode of the recirculation device 12, and the low-potential-side main electrode 17 by the wire 19. On the other hand, the electric circuit pattern 3 is connected to the high-potential-side main electrode 18 by the wire 19.

Figure 4:
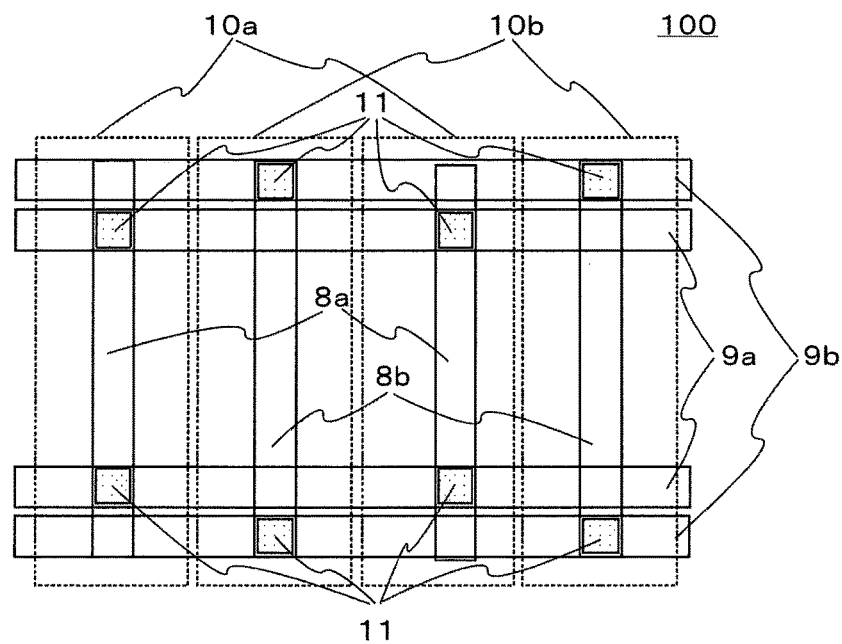
FIG. 4 is a plan view showing the configuration of a driving wire of a semiconductor chip mounted on the semiconductor device according to the first embodiment.

A wiring example of a gate electrode in the switching device 5 is explained. FIG. 4 is a plan view showing the configuration of a driving wire of a semiconductor chip mounted on the semiconductor device according to the first embodiment. The switching device 5 includes first metal wires 9a and second metal wires 9b on the surface electrode side. The first metal wires 9a and the second metal wires 9b are disposed, for example, around a terminal end portion of the switching device 5. The first metal wires 9a are electrically connected to the first gate-signal input section 7a. The second metal wires 9b are electrically connected to the second gate-signal input section 7b. The first metal wires 9a and the second metal wires 9b are electrically insulated by an insulating film (not shown).

First gate electrodes 8a are connected to the first metal wires 9a. Second gate electrodes 8b are connected to the second metal wires 9b. The connection of the first metal wires 9a and the first gate electrodes 8a and the connection of the second metal wires 9b and the second gate electrodes 8b are performed via contact holes 11. With this configuration, the first gate electrodes 8a and the second gate electrodes 8b are electrically insulated from each other in the switching device 5. The first gate electrodes 8a are connected to the first driving signal terminal 15. The second gate electrodes 8b are connected to the second driving signal terminal 16.

First switching regions 10a include the first gate electrodes 8a. In the first switching regions 10a, a channel current is controlled according to an electric charge amount supplied by a control signal input to the first gate electrodes 8a. Second switching regions 10b include the second gate electrodes 8b. In the second switching regions 10b, a channel current is controlled according to an electric charge amount supplied by a control signal input to the second gate electrodes 8b. The channel current means an electric current flowing in channels respectively formed in the first switching regions 10a and the second switching regions 10b by electric charges supplied to the first gate electrodes 8a and the second gate electrodes 8b.

The first switching regions 10a and the second switching regions 10b are formed in one switching device 5. The first switching regions 10a and the second switching regions 10b share the emitter electrode 6 and the collector electrode. Therefore, the first switching regions 10a and the second switching regions 10b are connected in parallel in the switching device 5.

The semiconductor device 100 is configured as explained above.

Figure 5:
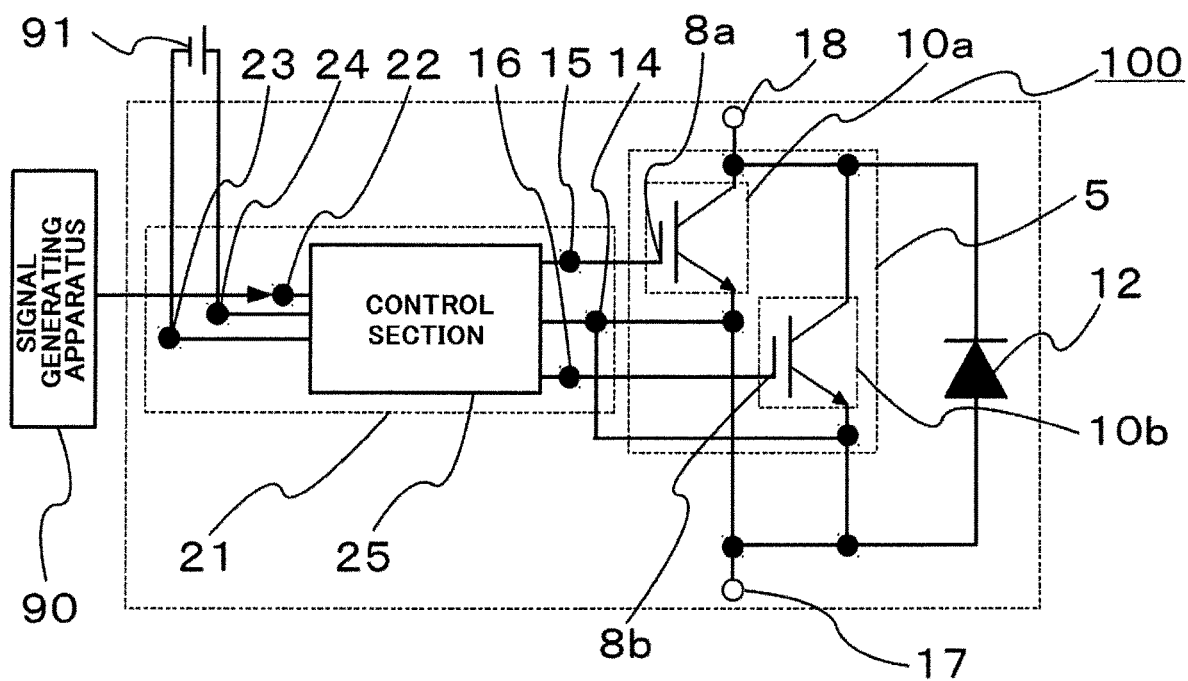
FIG. 5 is an equivalent circuit diagram of the semiconductor device according to the first embodiment of the present invention.

The operation of the semiconductor device 100 according to the first embodiment of the present invention is explained. FIG. 5 is an equivalent circuit diagram of the semiconductor device according to the first embodiment of the present invention. As shown in FIG. 5, the switching device 5 is represented by an equivalent circuit in which the first switching region 10a and the second witching region 100b are connected in parallel.

When a signal output from a signal generating apparatus 90 provided on the outside of the semiconductor device 100 is input to the control section 25 via the signal input terminal 22, the control section 25 outputs a first control signal via the first driving signal terminal 15 and outputs a second control signal via the second driving signal terminal 16.

The first control signal is input to the first gate electrode 8a of the first switching region 10a. The second control signal is input to the second gate electrode 8b of the second switching region 10b. When the first control signal is input to the first gate electrode 8a, electric charges are supplied to the first gate electrode 8a. The voltage of the first gate electrode 8a rises. Similarly, when the second control signal is input to the second gate electrode 8b, electric charges are supplied to the second gate electrode 8b. The voltage of the second gate electrode 8b rises. When the voltages of the first gate electrode 8a and the second gate electrode 8b become equivalent to the voltage of the power supply 91 connected between the reference-potential input terminal 23 and the driving-potential input terminal 24, the voltages of the first gate electrode 8a and the second gate electrode 8b do not rise. Almost no electric charges are supplied from the control section 25 to the first gate electrode 8a and the second gate electrode 8b. The voltage of the first gate electrode 8a is a voltage between the emitter electrode of the switching device and the first gate electrode 8a. The voltage of the second gate electrode 8b is a voltage between the emitter electrode of the switching device and the second gate electrode 8b. As shown in FIG. 5, the emitter electrode of the switching device is connected to the reference-potential signal terminal 14 and the low-potential-side main electrode 17. Therefore, for example, the reference-potential signal terminal 14 or the low-potential-side main electrode 17 may be set to reference potential. The reference potential and the voltage of the first gate electrode 8a or the voltage of the second electrode 8b may be measured.

With the configuration explained above, it is possible to supply electric charges respectively independently to the first gate electrode 8a and the second gate electrode 8b according to the first control signal and the second control signal output from the control section 25. That is, it is possible to respectively independently control voltage rises of the first gate electrode 8a and the second gate electrode 8b during turn-on of the switching device 5.

Figure 6:
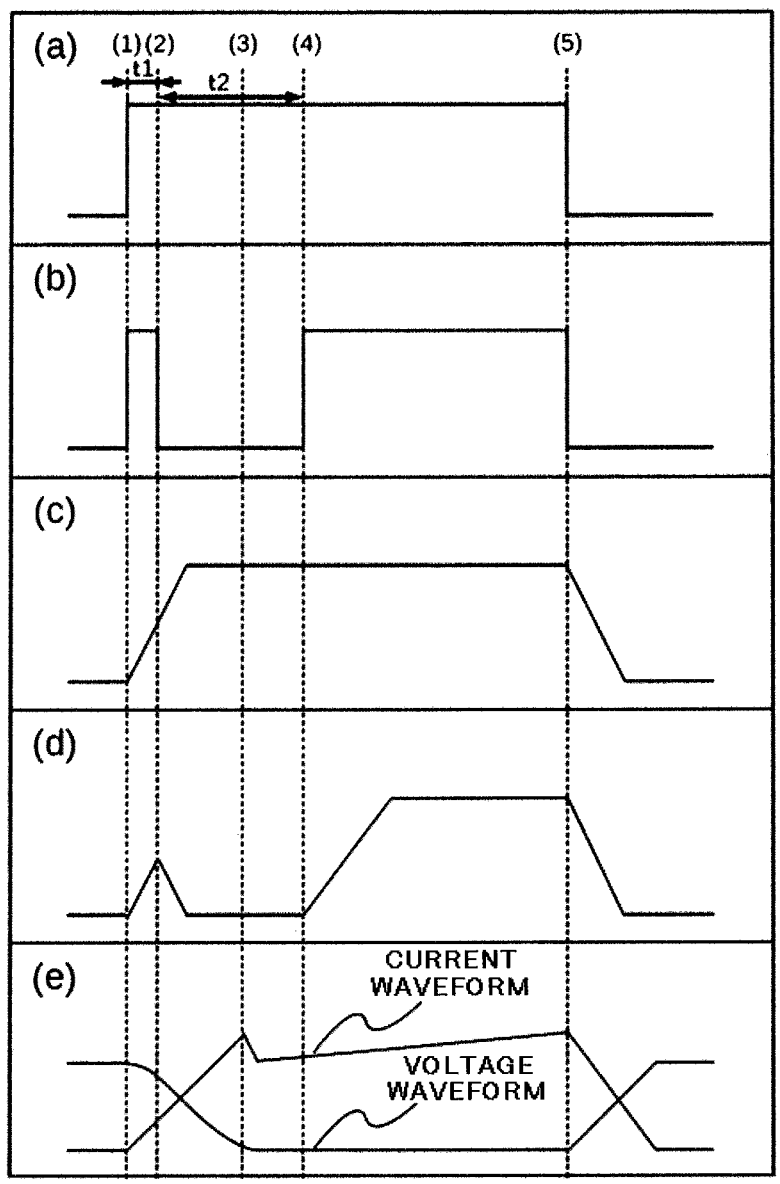
FIG. 6 is a timing chart showing the operation of the semiconductor device according to the first embodiment of the present invention.

FIG. 6 is a timing chart showing the operation of the semiconductor device according to the first embodiment of the present invention. The low-potential-side main electrode 17 and the high-potential-side main electrode 18 of the semiconductor device 100 are connected to an apparatus on the outside. A voltage is applied between the low-potential-side main electrode 17 and the high-potential-side main electrode 18. FIG. 6(a) shows an input state of the first control signal. FIG. 6(b) shows an input state of the second control signal. FIG. 6(c) shows the voltage of the first gate electrode 8a. FIG. 6(d) shows the voltage of the second gate electrode 8b. FIG. 6(e) shows an electric current flowing to the switching device 5 and a voltage between the emitter electrode and the collector electrode of the switching device 5, that is, at both ends of the switching device 5. The electric current flowing to the switching device 5 may be, for example, an electric current flowing in the low-potential-side main electrode 17. The voltage at both the ends of the switching device 5 indicates a potential difference between an emitter and a collector generally called Vce voltage or the like. (1) to (4) indicated by broken lines in FIG. 6 indicate times. (1) indicates time of a turn-on start of the semiconductor device 100. (2) indicates time when the output of the second control signal is interrupted. (3) indicates time when the turn-on of the semiconductor device 100 is completed, that is, the semiconductor device 100 shifts to a conduction state. (4) indicates time when the output of the second control signal is resumed. (5) indicates time when turn-off is started.

At the time (1), when a signal output from the signal generating apparatus 90 is input to the control section 25, the control section 25 simultaneously outputs the first control signal and the second control signal. Electric charge supply to the first gate electrode 8a is started by the output of the first control signal. Electric charge supply to the second gate electrode 8b is started by the output of the second control signal.

The control section 25 outputs the first control signal and the second control signal, stops the output of the second control after a first predetermined period t1, which is a period from the time (1) to the time (2), elapses, and interrupts the electric charge supply to the second gate electrode 8b. An upper limit of the first predetermined period t1 is time until the electric charge supply to the first gate electrode 8a is completed, that is, the voltage of the first gate electrode 8a is fixed. The upper limit of the first predetermined period t1 may be, for example, approximately several hundred nanoseconds. When a gate capacity of the switching device 5 is large or when the switching device 5 is operated in a high-temperature state, the first predetermined period t1 may be set to a longer period. The first predetermined period t1 may be changed by changing a circuit configuration of the control section 25.

The control section 25 outputs the second control signal again after a second predetermined period t2, which is a period from the time (2) to the time (4), elapses and resumes the electric charge supply to the second gate electrode 8b. The second predetermined period t2 may be set, for example, between several nanoseconds to 2 µs. The second predetermined period t2 is set such that electric charges are supplied to the second gate electrode 8b again by the second control signal after the turn-on is completed. Consequently, it is possible to make it easier to adjust a time change rate (dv/dt) of the voltage applied to both the ends of the switching device 5 during the turn-on. Time when the turn-on is completed is the time (3) shown in FIG. 6(e) and may be defined as time when the voltage at both the ends of the switching device 5 is 10% or less of the voltage at both the ends of the switching device 5 during the turn-on start.

At the time (5), when the signal input from the signal generating apparatus 90 to the control section 25 is stopped, the control section 25 stops the first control signal and the second control signal. Timing for stopping the second control signal may be simultaneous with timing for stopping the first control signal. The timing for stopping the second control signal and the timing for stopping the first control signal may be shifted by a predetermined time.

The following operation is repetition of the operation explained above.

Subsequently, effects of the semiconductor device according to the first embodiment are explained. In the semiconductor device 100 according to the first embodiment, the control section 25 can adjust the time change rate (dv/dt) of the voltage applied to both the ends of the switching device 5 during the turn-on by adjusting electric charges supplied to the second gate electrode 8b.

A channel current in the second switching region 10b has a correlation with electric charges supplied to the second gate electrode 8b. When the electric charges supplied to the second gate electrode 8b are reduced, that is, the first predetermined period t1 is reduced, the channel current in the second switching region 10b decreases. It is possible to delay a time change of a main electric current, that is, a collector current (ic) of the semiconductor device 100 by reducing the channel current of the second switching region 10b. As a result, it is possible to reduce the time change rate (dv/dt) of the voltage at both the ends of the switching device 5 during the turn-on.

When the time change rate (dv/dt) of the voltage applied to both the ends of the switching device 5 during the turn-on is too small, it is possible to perform adjustment for extending the first predetermined period t1 to increase the electric charges supplied to the second gate electrode 8b and increase the time change rate (dv/dt) of the voltage at both the ends of the switching device 5 during the turn-on.

Consequently, with the semiconductor device 100 according to the first embodiment of the present invention, the electric charges of the second gate electrode 8b can be adjusted by the control by the control section 25. Therefore, it is possible to adjust the time change rate (dv/dt) of the voltage applied to both the ends of the switching device 5 during the turn-on.

When the electric charges of the second gate electrode 8b are removed at the time (2) to the time (4), it is also possible to adjust the time change rate (dv/dt) of the voltage applied to both the ends of the switching device 5 during the turn-on. When the electric charges of the second gate electrode 8b are removed at the time (2) to the time (4), since the channel current flows from the second switching region until the electric charges are removed, it is also possible to adjust the time change rate (dv/dt) of the voltage at both the ends of the switching device 5 during the turn-on by adjusting the length of the first predetermined period t1. The removal of the electric charges or supply of electric charges having opposite potential can be performed by the same operation as the operation in the turn-off. When the operation explained above is performed, the voltage of the second gate electrode 8b at a time when t2 elapses is lower than the voltage of the second gate electrode 8b at a time when the first predetermined period t1 elapses.

Figure 7:
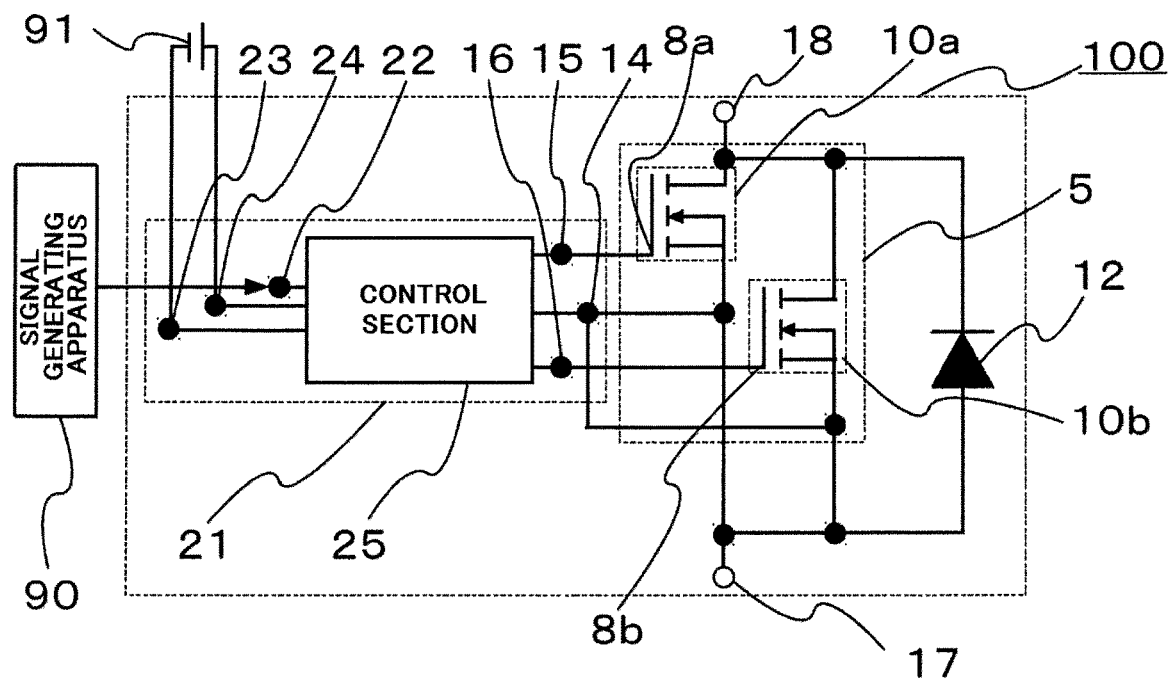
FIG. 7 is an equivalent circuit diagram of the semiconductor device according to the variation of the first embodiment of the present invention.

In the first embodiment, the semiconductor device 100 including the switching device 5 in which the first gate electrode 8a and the second gate electrode 8b are formed on one semiconductor substrate is explained. However, in a semiconductor device including two switching devices respectively formed on two semiconductor substrates, the two switching devices being connected in parallel, when a gate electrode of one switching device is set as a first gate electrode and a gate electrode of the other switching device is set as a second gate electrode, the same effects can be obtained by adjusting electric charges during turn-on of the second gate electrode as explained in the first embodiment. As shown in FIG. 7, when the IGBT is replaced with a MOSFET, the effect of enabling the adjustment of the time change rate (dv/dt) of the voltage applied to both the ends of the switching device 5 during the turn-on is also achieved. In both of the IGBT and the MOSFET, the switching device 5 may be formed on Si or may be formed on a wide gap semiconductor having a larger band gap than Si such as SiC or GaN.

In the above explanation of the first embodiment, the semiconductor device 100 is the semiconductor device of the case type including the resin case 13. However, the semiconductor device 100 may be a semiconductor device of a transfer mold type in which the components such as the switching device 5, the recirculation device 12, and the control board 21 are molded by epoxy resin or the like.

Second Embodiment

The configuration of a semiconductor device 200 according to a second embodiment of the present invention is explained. In the above explanation of the first embodiment, the second predetermined period t2 is controlled in the preset period by the configuration of the control section 25. However, in the second embodiment, the semiconductor device 200 includes a voltage detection circuit 250 for controlling the second predetermined period t2, and the second predetermined period t2 is controlled on the basis of a voltage between a high-potential-side signal terminal 260 and the reference-potential signal terminal 14 detected by the voltage detection circuit 250. In the second embodiment of the present invention, explanation about portions same as or corresponding to the portions in the first embodiment of the present invention is omitted.

Figure 8:
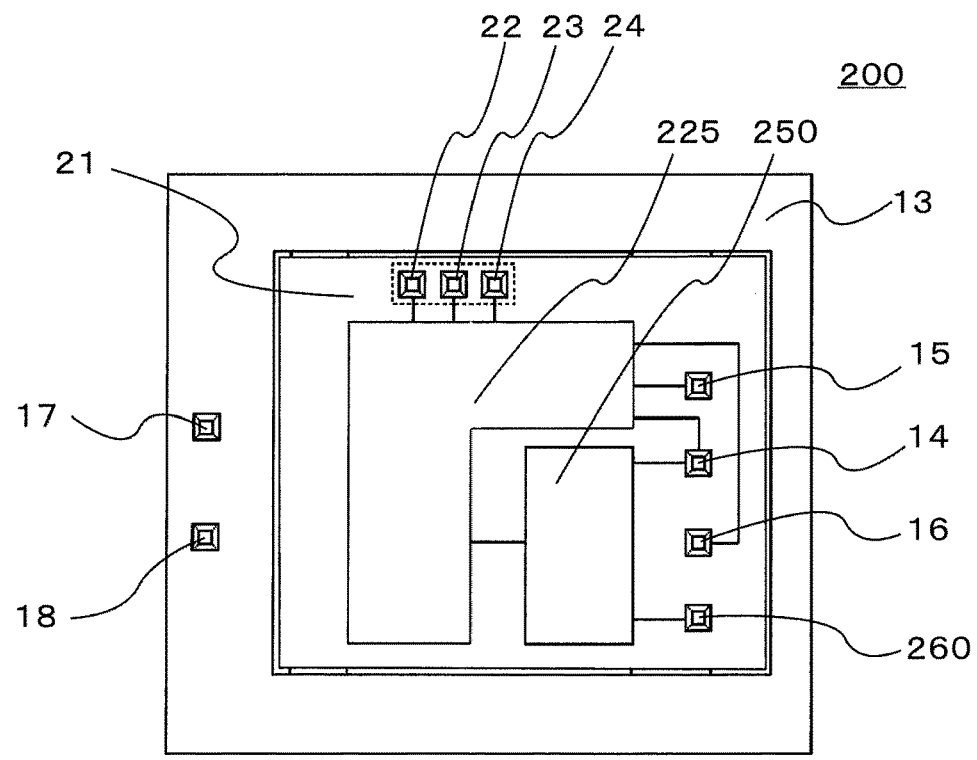
FIG. 8 is a plan view showing the configuration of the semiconductor device according to the second embodiment of the present invention.
Figure 9:
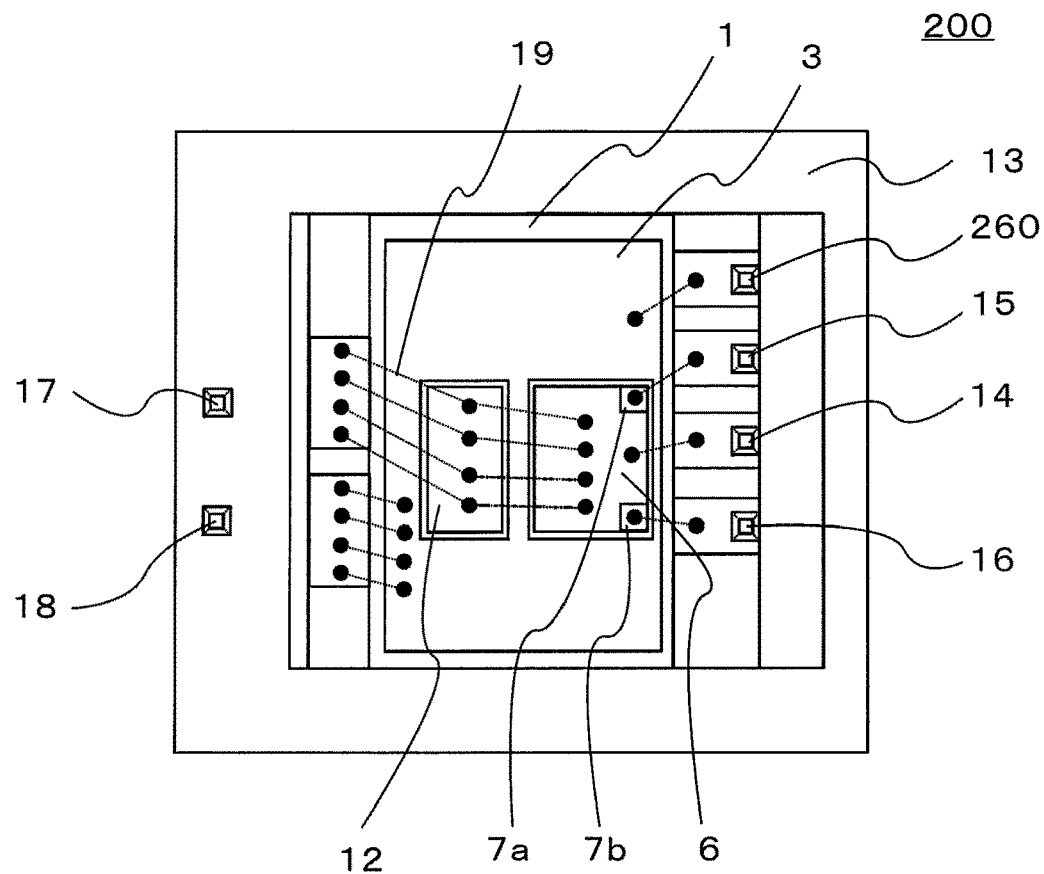
FIG. 9 is a plan view showing a configuration in which the control board of the semiconductor device according to the second embodiment of the present invention is removed.

The configuration of the semiconductor device 200 according to the second embodiment of the present invention is explained with reference to FIG. 8. FIG. 8 is a plan view showing the configuration of the semiconductor device according to the second embodiment of the present invention. FIG. 8 is a plan view showing the semiconductor device 200 viewed from above. The semiconductor device 200 is different from the semiconductor device 100 shown in FIG. 3 in a configuration in which the voltage detection circuit 250 is disposed in a control board 21. FIG. 9 is a plan view showing a configuration in which the control board of the semiconductor device according to the second embodiment of the present invention is removed. FIG. 9 is a plan view showing a state in which the control board 21 is removed in FIG. 8. The high-potential-side signal terminal 260 shown in FIG. 8 is a terminal connected to a collector of the switching device 5 via the wire 19 and the electric circuit pattern 3 as shown in FIG. 9.

The voltage detection circuit 250 is connected to the reference-potential signal terminal 14 and the high-potential-side signal terminal 260 via electrically independent conductive patterns on the control board 21. The voltage detection circuit 250 outputs a voltage between a collector and an emitter, that is, a voltage between the high-potential-side signal terminal 260 and the reference-potential signal terminal 14 to the control section 225.

Effects of the semiconductor device 200 according to the second embodiment of the present invention is explained with reference to FIG. 6. The semiconductor device 200 according to the second embodiment adjusts a period from the time (3) to the time (4) shown in FIG. 6. Operation up to the time (3) shown in FIG. 6 is the same as the operation of the semiconductor device 100 according to the first embodiment. Therefore, explanation of the operation is omitted.

A voltage waveform shown in FIG. 6(e) is the same as the voltage between the high-potential-side signal terminal 260 and the reference-potential signal terminal 14. The voltage of the reference-potential signal terminal 14 and the voltage of the high-potential-side signal terminal 260 is also information input to the voltage detection circuit 250. When the voltage between the high-potential-side signal terminal 260 and the reference-potential signal terminal 14 is equal to or smaller than a predetermined threshold, the voltage detection circuit 250 outputs a voltage detection signal to the control section 225. The threshold of the voltage for the voltage detection circuit 250 to output the voltage detection signal is set to a value less than 10% of a voltage during a turn-on start. This is because, as indicated by the voltage waveform shown in FIG. 6(e), the time change rate (dv/dt) of the voltage applied to both the ends of the switching device 5 is not fixed from the time (1) to the time (3) and, when the voltage during the turn-on start is set to 100%, the time change rate (dv/dt) is the highest while the voltage transitions from 90% to 10%. By setting the threshold of the voltage for the voltage detection circuit 250 to output the voltage detection signal to a value less than 10% of the voltage during the turn-on start, it is possible to increase an effect of reducing the time change rate (dv/dt) of the voltage applied to both the ends of the switching device 5.

When the voltage detection signal is input, the control section 225 outputs the second control signal again and raises the voltage of the second gate electrode 8b. That is, in the semiconductor device 200 according to the second embodiment, it is possible to start a voltage rise of the second gate electrode 8b in a short period after the turn-on is completed.

In a semiconductor device including a gate electrode, in general, as a temperature rise of the semiconductor device due to energization and a peripheral environment and an electric current to be switched are larger, a time change of the voltage applied to both the ends of the switching device 5 during the turn-on is gentler and the time change rate (dv/dt) is smaller. In the semiconductor device 200 according to the second embodiment of the present invention, the voltage of the second gate electrode 8b is raised when the voltage between the high-potential-side signal terminal 260 and the reference-potential signal terminal 14 is equal to or smaller than the predetermined threshold. Therefore, even if the time change rate (dv/dt) of the voltage applied to both the ends of the switching device 5 during the turn-on changes according to an environmental change, it is possible to automatically adjust timing for performing the voltage rise of second gate electrode 8b again to an optimum value. As a result, it is possible to reduce the period from the time (3) to the time (4) shown in FIG. 6. It is possible to reduce a conduction loss immediately after the turn-on.

The conduction loss can be reduced by increasing the channel current. The channel current is larger when a gate voltage is applied to both of the first gate electrode 8a and the second gate electrode 8b, that is, both of the first control signal and the second control signal are output than when the gate voltage is applied to only the first gate electrode 8a. Therefore, it is possible to reduce the conduction loss immediately after the turn-on by reducing the period from the time (3) to the time (4) shown in FIG. 6 and extending a time in which both of the first control signal and the second control signal are output. The semiconductor device 200 according to the second embodiment can automatically adjust the timing for performing the voltage rise of the second gate electrode 8b again to the optimum value and can reduce the conduction loss immediately after the turn-on.

The voltage detection circuit 250 only has to be able to detect a voltage between a high-potential side electrode and a low-potential side electrode of the first switching region 10a and the second switching region 10b connected in parallel. When the switching device 5 is the IGBT, the effects explained above are achieve if a voltage between the emitter electrode and the collector electrode can be detected. The high-potential side electrode includes a signal terminal and a main electrode electrically connected to the collector electrode and having a voltage equivalent to the voltage of the collector electrode. The low-potential side electrode includes a signal terminal and a main electrode electrically connected to the emitter electrode and having a voltage equivalent to the voltage of the emitter electrode.

Third Embodiment

Figure 10:
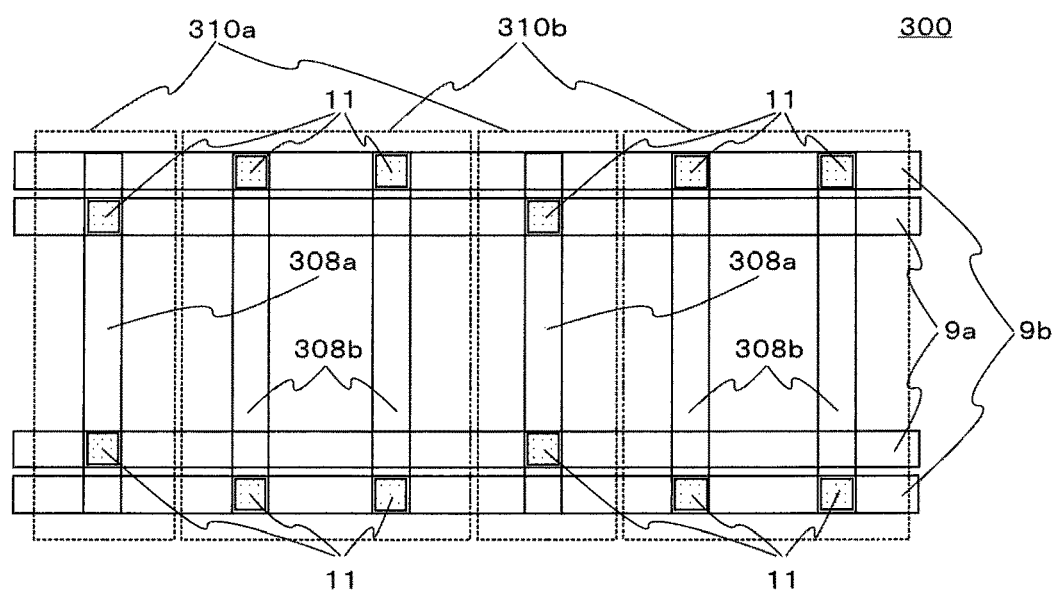
FIG. 10 is a plan view showing the configuration of a driving wire of a semiconductor chip mounted on a semiconductor device according to a third embodiment of the present invention.

FIG. 10 is a plan view showing the configuration of a driving wire of a semiconductor chip mounted on a semiconductor device according to a third embodiment of the present invention. A semiconductor device 300 according to the third embodiment of the present invention is configured such that an electric charge amount necessary for completion of a voltage rise of second gate electrodes 308b is larger than an electric charge amount necessary for completion of a voltage rise of first gate electrodes 308a. The electric charge amounts necessary for the voltage rise completion of the first gate electrodes 8a and the second gate electrodes 8b indicate electric charge amounts necessary for the first gate electrodes 308a and the second gate electrodes 308b until the first gate electrodes 308a and the second gate electrodes 308b have a voltage equivalent to a set voltage of the power supply 91. The semiconductor device 300 in the third embodiment of the present invention is the same as the configuration of the semiconductor devices in the first and second embodiments except the configuration of the driving wire of the semiconductor chip shown in FIG. 10. Explanation about portions same as or corresponding to the portions in the first and second embodiments of the present invention is omitted.

In FIG. 10, the electric charge amounts necessary for the completion of the voltage rise of the first gate electrodes 308a and the second gate electrodes 308b are adjusted by changing a ratio of the number of the first gate electrodes 308a and the number of the second gate electrodes 308b. The number of the second gate electrodes 308b is set larger than the number of the first gate electrodes 308a to set the capacitance of the first gate electrodes 308a larger than the capacitance of the second gate electrodes 308b such that the electric charge amount necessary for the completion of the voltage rise of the second gate electrodes 308b is larger than the electric charge amount necessary for the completion of the voltage rise of the first gate electrodes 308a. For example, in FIG. 10, the number of the second gate electrodes 308b is set to be twice as large as the number of the first gate electrodes 308a. In FIG. 10, a ratio of the capacitance of the first gate electrodes 308a and the capacitance of the second gate electrodes 308b is changed by changing the ratio of the number of the first gate electrodes 308a and the number of the second gate electrodes 308b. However, the ratio of the capacitance of the first gate electrodes 308a and the capacitance of the second gate electrodes 308b may be changed by changing a ratio of the area of the first gate electrodes 308a and the area of the second gate electrodes 308b.

Subsequently, effects of the semiconductor device according to the third embodiment are explained. With the configuration explained above, when compared in a state in which the supply of the electric charge amounts necessary for the completion of the voltage rise of the first gate electrodes 308a and the second gate electrodes 308b is completed, a channel current of second switching regions 310b can be set larger than a channel current of first switching regions 310a. A time change rate (dv/dt) of a voltage applied to both ends of a switching device 305 during turn-on has a correlation with the channel current. Therefore, it is possible to increase the width of adjustment of the time change rate (dv/dt) of the voltage applied to both the ends of the switching device 305 by increasing a ratio of the channel current of the second switching regions 310b to the channel current of the first switching regions 310a, that is, increasing a ratio of the electric charge necessary for the completion of the voltage rise of the second gate electrodes 308b. As a result, it is possible to make it easier to adjust controllability and a turn-on loss during the turn-on.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-168916, filed on Sep. 10, 2018 including specification, claims, drawings and summary, on which the Convention priority of the present application is based, is incorporated herein by reference in its entirety.

The invention claimed is:

1. A semiconductor device comprising:
a first switching region including a first gate electrode wherein a channel current of the first switching region is controlled according to an electric charge amount supplied by a first control signal input to the first gate electrode;
a second switching region including a second gate electrode and connected in parallel with the first switching region wherein a channel current of the second switching region is controlled according to an electric charge amount supplied by a second control signal input to the second gate electrode; and
a control section outputting the first control signal for turning-on the first switching region to the first gate electrode and the second control signal for turning-on the second switching region to the second gate electrode,
wherein the control section stops outputting the second control signal after a first predetermined period elapses from a start of outputting the first and second control signals, and outputs the second control signal after a second predetermined period elapses from a stop of outputting the second control signal.

2. The semiconductor device according to claim 1, wherein a voltage of the second gate electrode at a time when the second predetermined period elapses is lower than a voltage of the second gate electrode at a time when the first predetermined period elapses.

3. The semiconductor device according to claim 1, wherein the first switching region and the second switching region are provided on one semiconductor substrate.

4. The semiconductor device according to claim 1, wherein the first switching region and the second switching region are provided on different semiconductor substrates respectively.

5. The semiconductor device according to claim 1, comprising a voltage detection circuit detecting a voltage between a high-potential side electrode and a low-potential side electrode,
wherein the first switching region or the second switching region is electrically connected to the high-potential side electrode and the low-potential side electrode, and
the control section controls the second predetermined period based on the voltage between the high-potential side electrode and the low-potential side electrode detected by the voltage detection circuit.

6. The semiconductor device according to claim 5, wherein when a voltage between the high-potential side electrode and the low-potential side electrode detected by the voltage detection circuit during the second predetermined period is smaller than a predetermined threshold which is smaller than a voltage between the high-potential side electrode and the low-potential side electrode detected by the voltage detection circuit at the start of the first predetermined period, the control section outputs the second control signal.

7. The semiconductor device according to claim 6, wherein the threshold is less than 10% of the voltage between the high-potential side electrode and the low-potential side electrode detected by the voltage detection circuit at the start of the first predetermined period.

8. The semiconductor device according to claim 1, wherein the electric charge amount supplied to the second gate electrode is larger than the electric charge amount supplied to the first gate electrode.

9. The semiconductor device according to claim 8, wherein capacitance of the second gate electrode is larger than capacitance of the first gate electrode.

10. The semiconductor device according to claim 9, wherein the number of the second gate electrodes is larger than the number of the first gate electrodes.

11. The semiconductor device according to claim 1, wherein the first switching region and the second switching region are provided in a wide-bandgap semiconductor having a bandgap wider than that of silicon.

* * * * *